(12) United States Patent
Xu et al.

(10) Patent No.: US 9,479,173 B1
(45) Date of Patent: Oct. 25, 2016

(54) TRANSITION ACCELERATOR CIRCUITRY

(75) Inventors: Yanzhong Xu, Santa Clara, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 637 days.

(21) Appl. No.: 13/360,585

(22) Filed: Jan. 27, 2012

(51) Int. Cl.
*H03K 19/0175* (2006.01)
*H03K 19/0185* (2006.01)

(52) U.S. Cl.
CPC ................ *H03K 19/018521* (2013.01)

(58) Field of Classification Search
CPC .......... H03K 17/693; H03K 19/17736; H03K 19/1778; H03K 19/17704; H03K 19/17796; H03K 5/133; H03K 19/1737; H03K 19/17784; H03K 17/08122; H03K 21/10
USPC ....... 326/82–83, 86, 37–41, 44–45, 47, 101; 327/201–210, 267–278, 15–159, 327/355–360, 218
See application file for complete search history.

(56) References Cited

U.S. PATENT DOCUMENTS

| | | | |
|---|---|---|---|
| 6,476,638 B1 * | 11/2002 | Zhou | H03K 3/3565 326/68 |
| 6,653,875 B2 * | 11/2003 | Partsch et al. | 327/158 |
| 6,664,837 B1 * | 12/2003 | Oh et al. | 327/270 |
| 6,665,354 B1 * | 12/2003 | Drapkin et al. | 375/316 |
| 6,982,579 B2 * | 1/2006 | Lee | 327/158 |
| 7,417,454 B1 * | 8/2008 | Rahman et al. | 326/38 |
| 7,477,073 B1 * | 1/2009 | Tuan et al. | 326/41 |
| 7,816,948 B1 * | 10/2010 | Sanchez | 326/80 |
| 7,821,312 B1 * | 10/2010 | Zheng | 327/158 |
| 7,948,792 B1 * | 5/2011 | Lee et al. | 365/154 |
| 7,982,501 B2 * | 7/2011 | Lewis | 326/83 |
| 2002/0079937 A1 * | 6/2002 | Xanthopoulos | 327/158 |
| 2003/0169085 A1 * | 9/2003 | Partsch et al. | 327/158 |
| 2004/0027160 A1 * | 2/2004 | Joshi | H03K 19/01858 326/81 |
| 2008/0054943 A1 * | 3/2008 | Ramaraju | H03K 19/20 326/83 |
| 2008/0094105 A1 * | 4/2008 | Santurkar | H03K 19/094 326/68 |
| 2011/0043262 A1 * | 2/2011 | Watanabe | 327/158 |
| 2011/0234283 A1 * | 9/2011 | Wu | 327/202 |

OTHER PUBLICATIONS

Nezamfar, B.; Alon, E.; Horowitz, M.; , "Energy—Performance Tunable Logic," Solid-State Circuits, IEEE Journal of, vol. 44, No. 9, pp. 2554-2567, Sep. 2009, doi: 10.1109/JSSC.2009.2025344, URL: http://ieeexplore.ieee.org/stamp/stamp.jsp?tp=&arnumber=5226760&isnumber=5226685.

Duchene, P.; Declercq, M.J.; Kang, S.M.; , "Simple CMOS transition accelerator circuit," Electronics Letters, vol. 27 No. 4, pp. 300-302, Feb. 14, 1991, doi: 10.1049/el:19910189, URL: http://ieeexplore.ieee.org/stamp/stamp.jsp?tp=&arnumber=86720&isnumber=2825.

* cited by examiner

*Primary Examiner* — Anh Tran
(74) *Attorney, Agent, or Firm* — Michael H. Lyons

(57) ABSTRACT

Circuits and techniques for operating an integrated circuit (IC) with a transition accelerator circuit are disclosed. A disclosed circuit includes an inverter with an input, first and second power supply inputs, and an output. The input may receive an input signal from an external component. A first multiplexer, operable to couple either a first voltage level or a second voltage level to the first power supply input based on a control input, is coupled to the first power supply input of the inverter. An input of a delay circuit is coupled to the output of the inverter and an output of the delay circuit is coupled to the control input of the first multiplexer.

16 Claims, 5 Drawing Sheets

TRANSITION ACCELERATOR CIRCUITRY

BACKGROUND

Integrated circuits (ICs) include circuitry and multiple logic blocks that may be configured to perform any of a variety of functions. Signals from one logic block may be routed to another logic block through routing wires or routing paths on the IC.

Generally, different logic blocks may be placed anywhere on the IC. Some logic blocks may be placed nearer to each other while other logic blocks may be placed further apart from each other. Depending on the distance between the logic blocks, routing wires that connect one logic block to another may have different lengths.

The lengths of the wires may range from a few microns to hundreds or even thousands of microns. The speed of the signals propagating through the wires may be affected by the different lengths of the wires. Generally, a signal travelling through a longer routing path will experience more delay than a signal travelling through a shorter routing path.

Apart from the length of the wires, the width of the routing wires may also affect the speed of the signals and consequently, the overall speed of the IC. Typically, as process nodes become smaller, more circuits may be placed on the IC. As such, thinner routing wires may be needed in order to accommodate all the different circuits on the IC.

However, thinner wires may further affect the overall speed of the IC as the electrical resistance of a wire is directly proportional to the length of the wire and inversely proportional to the area (i.e., the width or diameter) of the wire. In other words, electrical signals travelling through longer and thinner wires may be slower compared to electrical signals travelling through shorter and wider wires.

Additionally, as there may generally be different paths connecting different circuitry and logic blocks on an IC, pass gates are generally used to route signals through various paths on the IC. For instance, a routing path or wire may branch out to two different paths and a signal travelling through that routing path may be routed to either one of the branches. As such, the overall speed of the IC may also be limited by the strength of these pass gates.

Therefore, based on all these different factors, there may be some undesirable delay as signals are routed through various routing paths on the IC. The delay associated with the routing paths may adversely affect the overall performance of the IC.

SUMMARY

A transition accelerator circuit is needed to reduce delay when routing signals from one portion of the IC to another and to improve the overall speed of the IC. Embodiments of the present invention include circuits and techniques to improve the speed of routing paths by dynamically adjusting trigger points of inverters on the routing paths.

It is appreciated that the present invention can be implemented in numerous ways, such as a process, an apparatus, a system, a device, or a method on a computer readable medium. Several inventive embodiments of the present invention are described below.

In one embodiment, a circuit is disclosed. The circuit includes an inverter having an input that is operable to receive an input signal from an external component, first and second power supply inputs, and an output. A first multiplexer, operable to couple either a first voltage level or a second voltage level to the first power supply input, is coupled to the first power supply input of the inverter. The first multiplexer also includes a control input. The circuit further includes a delay circuit with an input and an output. The input of the delay circuit is coupled to the output of the inverter and the output of the delay circuit is coupled to the control input of the first multiplexer.

In another embodiment, another circuit is disclosed. The circuit includes an input terminal that is coupled to receive an input signal and a first inverter circuit coupled to the input terminal. The first inverter circuit has a first trigger point as the input signal transitions from a logic low level to a logic high level. The first inverter circuit further has a second trigger point as the input signal transitions from the logic high level to the logic low level. A shifting circuit is coupled to the first inverter circuit. The shifting circuit is operable to provide trigger signals to the first inverter circuit that set the first and second trigger points at different voltages.

In yet another embodiment, a method for accelerating a transition of a signal is disclosed. The method includes receiving an input signal at an input terminal of an inverter. The inverter has first and second power supply inputs and a signal-varying trigger point, which may sometimes be referred to herein as a time-varying trigger point. The signal-varying trigger point of the inverter is set to a first trigger point voltage with trigger point shift circuitry when the input signal is at a logic low level. The signal-varying trigger point of the inverter is further set to a second trigger point voltage with the trigger point shift circuitry when the input signal is at a logic high level. The first trigger point voltage may be lower than the second trigger point voltage.

Further features of the invention, its nature and various advantages will be more apparent from the accompanying drawings and the following detailed description of the preferred embodiments.

DETAILED DESCRIPTION

The embodiments provided herein include circuitry and techniques to improve routing path speed on an integrated circuit (IC).

It will be obvious, however, to one skilled in the art, that the present exemplary embodiments may be practiced without some or all of these specific details. In other instances, well-known operations have not been described in detail in order not to unnecessarily obscure the present embodiments.

Generally, an IC includes wires or routing paths that connect different parts of the IC. For instance, signals may be transmitted from one logic block (e.g., a phase-locked loop (PLL)) to another logic block (e.g., a storage block) through various routing paths on the IC. The logic blocks may be close to each other or far apart. The strength of a signal is generally not affected when the signal is travelling between logic blocks that are relatively close to each other. However, some signal strength or speed may be lost when the signal is propagated from one block to another through a relatively long routing path.

Routing paths may have pass gates or control circuitry to route signals through different paths on the IC. In addition to pass gates and other control circuitry such as multiplexers, a routing path may also include receiver and driver circuitry. Generally, receiver and driver circuitry may include inverters that are used to drive signals through a routing path. Therefore, improving the speed of the receivers and drivers on the routing path may substantially improve the overall speed of the routing path.

It may thus desirable to have a transition accelerator circuit that is operable to adaptively adjust the trigger points of some or all of the inverters that form part of the receiver and driver circuitry. The transition accelerator circuit may lower a trip point voltage of an inverter when a signal is transitioning from a logic low level to a logic high level and may increase the trip point voltage of the inverter when the signal is transitioning from the logic high level back to the logic low level. This allows faster signal transitions as signals travel through different circuit blocks on the IC.

One of the embodiments describes a transition accelerator circuit that includes multiplexers that are operable to supply different voltages to an inverter circuit to dynamically adjust the trip points of the inverter circuit. With the multiplexers providing different voltages depending on the state of the received signal, the inverter circuit may be operable to invert the received signal within a shorter period of time, when compared to inverters having a fixed trip point.

Figure 1:
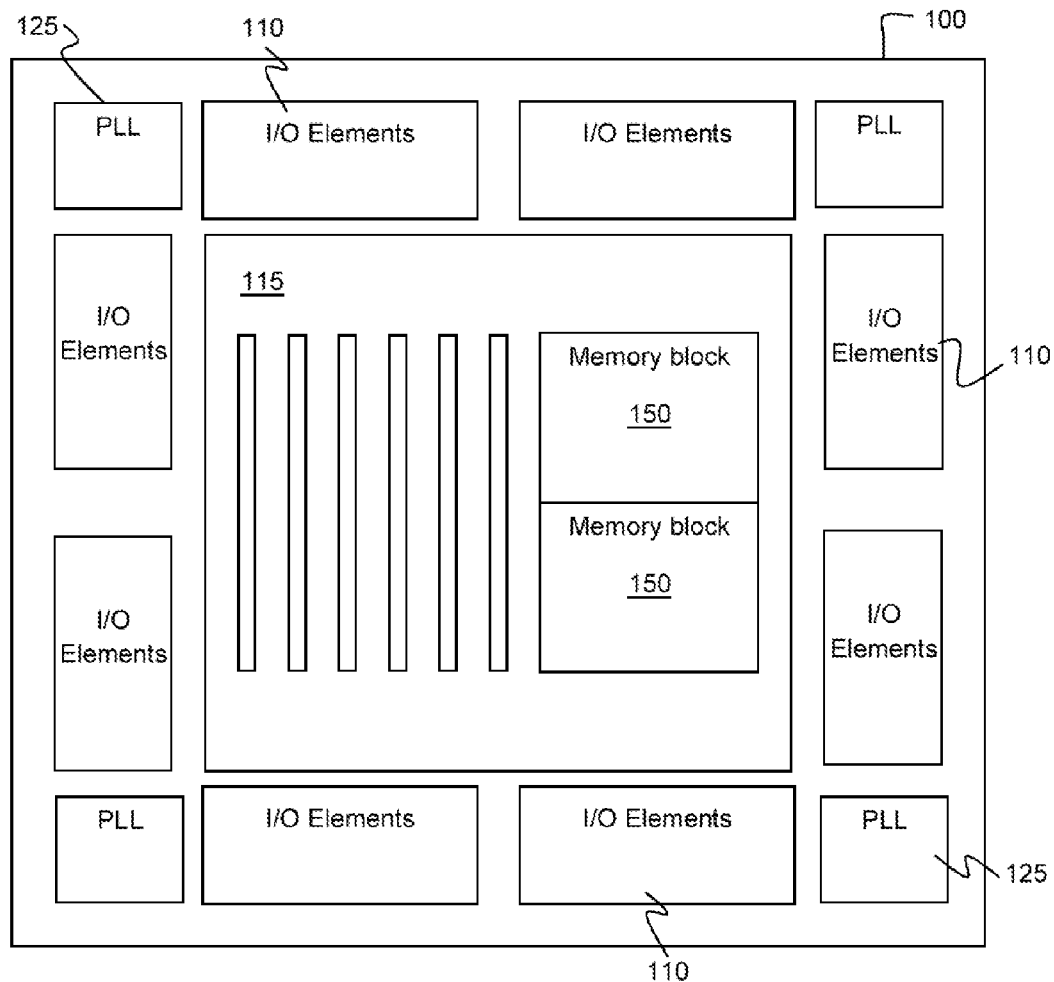
FIG. 1 is a simplified block diagram of an IC in accordance with an embodiment of the present invention.

FIG. 1, meant to be illustrative and not limiting, shows a simplified block diagram of IC 100 that can implement embodiments of the present invention. IC 100 includes core logic region 115 and input-output elements 110. Other auxiliary circuits such as phase-locked loops (PLLs) 125 for clock generation and timing, can be located outside the core logic region 115 (e.g., at corners of IC 100 and adjacent to input-output elements 110).

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to produce control signals that configure the LEs and groups of LEs and LABs to perform the desired logical functions. Core logic region 115 may also include a plurality of embedded memory blocks 150 that can be used to perform a variety of functions.

Input-output elements 110 may also include input-output buffers that connect IC 100 to other external components. Signals from core region 115 are transmitted through input-output elements 110 to external components that may be connected to IC 100. A single device like IC 100 can potentially support a variety of different interfaces and each individual input-output bank 110 can support a different input-output standard with a different interface or a different voltage level.

IC 100 receives signals from external circuitry at input-output elements 110. Signals may be routed from input-output elements 100 to core logic region 115 and other logic blocks on IC 100. Core logic region 115 and other logic blocks on IC 100 may perform functions based on the signals received. Signals may be sent from core logic region 115 and other relevant logic blocks of IC 100 to other external circuitry or components that may be connected to IC 100 through input-output elements 110. It should be appreciated that routing paths or routing wires may be used to route signals from input-output elements 100 to core logic region 115 or other logic blocks on IC 100.

Figure 2:
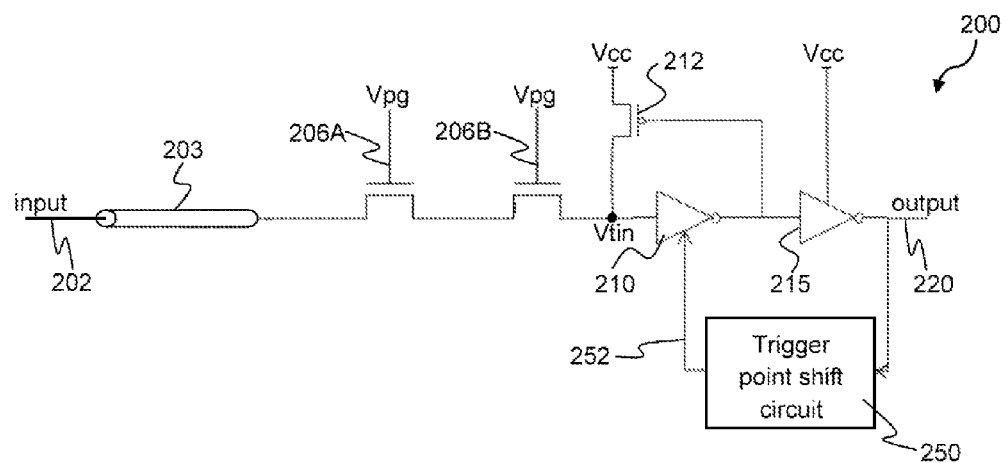
FIG. 2 is a schematic diagram of a routing circuit with a trigger point shift circuit in accordance with an embodiment of the present invention.

FIG. 2, meant to be illustrative and not limiting, shows routing circuit 200 as one embodiment in accordance with the present invention. Routing circuit 200 may be a routing path on an IC device (e.g., IC 100 of FIG. 1) that is used to transmit signals between different circuits on the IC device. Signals are received at input terminal 202 of routing circuit 200, sent through a length of wire 203 (e.g., a conductive trace), and transmitted through different circuits such as pass gates 206A and 206B and inverter circuits 210 and 215, before being transmitted to different circuit blocks on the IC through output terminal 220.

Signals may be received from different circuits on the IC at input terminal 202. In one instance, a signal received at input terminal 202 may be transmitted from an embedded memory block on the IC and may be transmitted through routing circuit 200 (which may include pass gates such as pass gates 206A and 206B) to a logic block on the IC that performs specific functions based. In another instance, input terminal 202 may be coupled to a driver from another routing circuit.

Pass gates 206A and 206B may be operable to route signals received at input terminal 202 to different routes on the IC. In one embodiment, pass gates 206A and 206B may be N-channel transistors that may be coupled to a voltage level. In one embodiment, pass gates 206A and 206B may be coupled to a voltage level, Vpg, that is relatively higher than the voltage level, Vcc, coupled to inverter circuit and the source-drain terminal of transistor 212. In such arrangements, pass gates 206A and 206B may be described as being overdriven. It should be appreciated that the relatively higher voltage level may facilitate the transition of the input signal received from input terminal 202. In an exemplary embodiment, the voltage level, Vpg, coupled to pass gates 206A and 206B, may be configurable.

Inverter circuit 210 is coupled to receive signals from input terminal 202 that travel through pass gates 206A and 206B. In the embodiment of FIG. 2, a P-channel pull-up transistor 212 is coupled between pass gate 206B and inverter circuit 210. The gate of transistor 212 may be coupled to the output of inverter circuit 210.

In one embodiment, when the input signal received at the input terminal of inverter circuit 210 is transitioning from a logic low level, 0, to a logic high level, 1, a logic low level is initially received at the input terminal of inverter circuit 210. Initially (e.g., while the input is still at the logic low level), inverter circuit 210 inverts the received input and outputs a logic high level, 1. As such, transistor 212 is initially disabled as the gate of transistor 212 receives a logic high level from the output of inverter circuit 210. As the input signal transitions to the logic high level, the node, Vtin, at the input terminal of inverter circuit 210 is pulled up by the input signal. Once inverter 210 flips (e.g., once the input at node Vtin is high enough that the output of inverter 210 goes low), transistor 212 is turned on and transistor 212 pulls node Vtin to the logic high level. Transistor 212 may compensate for any voltage drops in the logic high input signal (e.g., in the signal received at terminal 202) by ensuring that logic high signals received by inverter 210 are at the logic high level (e.g., are at Vcc, instead of an intermediate voltage).

When the input signal received at the input terminal of inverter circuit 210 is transitioning from a logic high level, 1, to a logic low level, 0, a logic high level is initially received at the input terminal of inverter circuit 210. Initially, inverter circuit 210 inverts the received input and outputs a logic low level, 0. As such, transistor 212 is enabled as the gate of transistor 212 receives a logic low level from the output of inverter circuit 210. As the input signal (e.g., from terminal 202) transitions to the logic low level, the input signal pulls the node, Vtin, at the input terminal of inverter circuit 210 down (overcoming the pull-up drive provided by transistor 212). Once inverter 210 flips, transistor 212 is turned off. Accordingly, the input signal pulls node Vtin low (e.g., to ground).

Another inverter circuit, inverter circuit 215, may be coupled to inverter circuit 210. It should be appreciated that inverter circuit 210 may be a receiver circuit and inverter circuit 215 may be a driver circuit that may be used to optimize signals in circuit 200. In an exemplary embodiment, inverter circuit 215 may have a greater drive strength compared to inverter circuit 210.

It should be appreciated that drive strength may sometimes be referred to as output current capability. Generally, drive strength or output current capability may correspond to a gate width of a transistor. Therefore, in one embodiment, the pull-up and pull-down transistors of inverter circuit 215 may have gate widths that are greater than the pull-up and pull-down transistors (e.g., the N-channel and the P-channel transistors) in inverter circuit 210.

In one embodiment, in order to further optimize the transition speed of inverter circuits 210 and 215, trigger point shift circuit 250 may be coupled to inverter circuit 210. In an exemplary embodiment, inverter circuit 210 may have a first trigger point as the input signal received at node Vtin transitions from a logic low level to a logic high level and a second trigger point when the input signal transitions from a logic high level to a logic low level. The first and second trigger points may be trigger points at different voltages based on signals received from trigger point shift circuit 250.

Figure 3A:
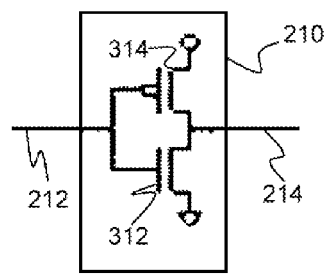
FIG. 3A is a schematic diagram of an inverter circuit in accordance with an embodiment of the present invention.

FIG. 3A, meant to be illustrative and not limiting, shows a detailed representation of an inverter circuit such as inverter circuit 210 (and other inverter circuits such as inverter circuit 215). Inverter circuit 210 is formed by two transistors 312 and 314 that are coupled together. In one embodiment, transistor 312 is an N-channel transistor and transistor 314 if a P-channel transistor. The gates of transistors 312 and 314 are coupled together to form input terminal 212 of inverter circuit 210 while source-drain terminals of transistors 312 and 314 form output terminal 214 of inverter circuit 210. In the embodiment of FIG. 2, input terminal 212 is coupled to node Vtin and output terminal 214 of inverter circuit 210 is coupled to inverter circuit 215. A source-drain terminal of transistor 314 may be coupled to one voltage level while a source-drain terminal of transistor 312 may be coupled to another voltage level.

Figure 3B:
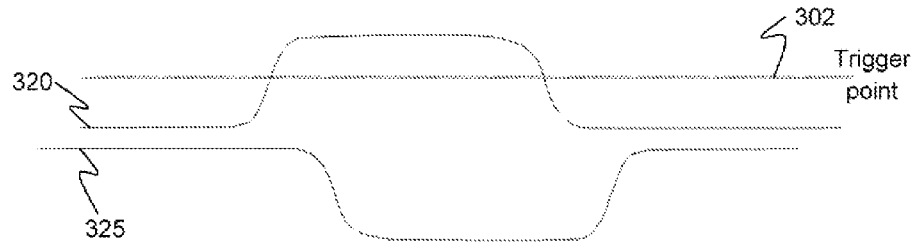
FIG. 3B shows two exemplary waveforms of a signal transitioning from one logic level to another logic level based on a static trigger point of an inverter circuit.

FIG. 3B, meant to be illustrative and not limiting, shows exemplary waveforms 320 and 325 of a signal transitioning from one logic level to another logic level based on static trigger point 302 of an inverter circuit. In one embodiment the inverter circuit may be similar to inverter circuit 210 shown in FIG. 3A. However, unlike inverter circuit 210, the inverter circuit may not be coupled to a trigger point shift circuit similar to trigger point shift circuit 250 of FIG. 2, and as such, trigger point 302 of the inverter circuit may not be adjustable.

Waveform 320 represents a signal transitioning from a logic low level to a logic high level and from the logic high level back to the logic low level after a period of time. As shown in FIG. 3B, as the signal transitions from a logic low level to a logic high level, the signal is inverted as it reaches trigger point 302. As the signal transitions from the logic high level back to the logic low level, the signal is inverted again as it reaches trigger point 302.

Waveform 325 represents the inversion of the signal as it transitions between two different logic levels. In the embodiment of FIG. 3B, trigger point 302 does not change (i.e., the output of the inverter flips when the input reaches the same trigger point, trigger point 302, whether the signal is transitioning from a logic low level to a logic high level or from a logic high level to a logic low level).

Figure 4A:
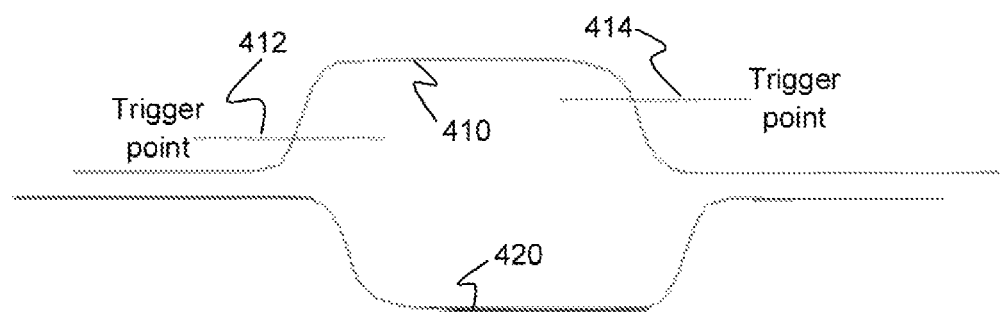
FIG. 4A shows two exemplary waveforms of a signal transitioning from one logic level to another logic level based on two trigger points of a signal-varying trigger point of another inverter circuit in accordance with an embodiment of the present invention.

FIG. 4A, meant to be illustrative and not limiting, shows exemplary waveforms 410 and 420 of a signal transitioning from one logic level to another logic level based on trigger points 412 and 414 of another inverter circuit. In one embodiment the inverter circuit may be coupled to a trigger point shift circuit similar to trigger point shift circuit 250 of FIG. 2.

Waveform 410 represents a signal transitioning from a logic low level to a logic high level and from the logic high level back to the logic low level after a period of time. Waveform 420 represents the inversion of the signal as it transitions between the two different logic levels.

As shown in FIG. 4A, as the signal transitions from a logic low level to a logic high level, the signal is inverted as it reaches first trigger point 412. As the signal transitions from the logic high level back to the logic low level, the signal is inverted again as it reaches second trigger point 414. In an exemplary embodiment, first trigger point 412 may be a lower voltage level compared to second trigger point 414.

In one embodiment, by having first and second trigger points 412 and 414 at different voltage levels, an inverter circuit coupled to receive adjustable trigger points from a trigger point shift circuit may invert a signal faster than an inverter circuit with a constant trigger point (e.g., an inverter circuit having a static trigger point such as trigger point 302 of FIG. 3B).

Figure 4B:
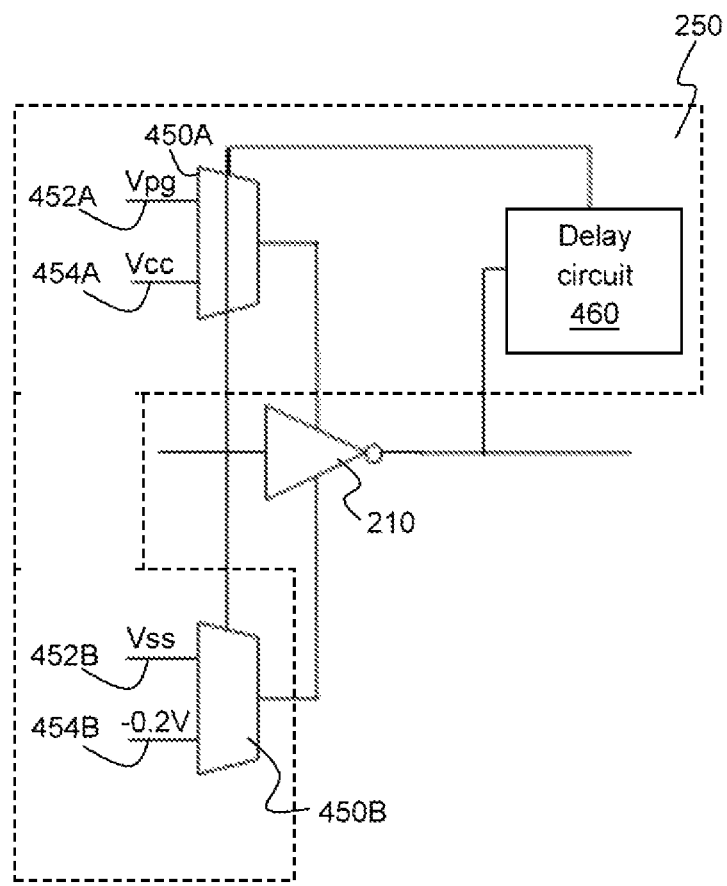
FIG. 4B is a schematic diagram of a trigger point shift circuit as one embodiment in accordance with the present invention.

FIG. 4B, meant to be illustrative and not limiting, shows a more detailed representation of trigger point shift circuit 250 as one embodiment in accordance with the present invention. In the embodiment of FIG. 4B, trigger point shift circuit 250 includes two multiplexers, 450A and 450B, and delay circuit 360. Multiplexers 450A and 450B are coupled to two input terminals of inverter circuit 210 and delay circuit 460 may be coupled to the output of inverter circuit 210.

In an exemplary embodiment, inverter circuit 210 includes two transistors coupled in series similar to P-channel transistor 314 and N-channel transistor 312 or FIG. 3A. As such, the output of multiplexer 450A may be coupled to a source-drain terminal of a P-channel transistor in inverter circuit 210 and the output of multiplexer 450B may be coupled to a source-drain terminal of an N-channel transistor in inverter circuit 210.

Multiplexer 450A may be operable to select either input 452A or 454A as an output to inverter circuit 210. In one embodiment, a first voltage level, Vpg, may be coupled to input 452A while a second voltage level, Vcc, may be coupled to input 454A of multiplexer 450A. In an exemplary embodiment, Vpg may be a relatively higher voltage compared to Vcc.

Multiplexer 450B may be operable to select either input 452B or 454B as an output to inverter circuit 210. In an exemplary embodiment, inputs 452B and 454B may be coupled to ground and a negative voltage, respectively. In the embodiment of FIG. 4B, input 452B is coupled to Vss and the input of 454B is coupled to −0.2V.

In an exemplary embodiment when a signal received at input Vtin of transistor 210 is transitioning from a low logic level to a high logic level, multiplexer 450A may be operable to transmit a first voltage level (e.g., Vcc) to inverter circuit 210 and multiplexer 450B may be operable to transmit a second voltage level (e.g., −0.2v) to inverter circuit 210. Multiplexers 450A and 450B may provide these voltages (e.g., the first voltage level and the second voltage level) prior to, during, and until slightly after the transition of the input signal from the low logic level to the high logic level. Conversely, when the signal at the input Vtin of transistor 210 is transitioning from a high logic level to a low logic level, multiplexer 450A may be operable to transmit a third voltage level (e.g., Vpg) to inverter circuit 210 and multiplexer 450B may be operable to transmit a fourth voltage level (e.g., Vss) to inverter circuit 210. Multiplexers 450A and 450B may provide these voltages (e.g., the third voltage level and the fourth voltage level) prior to, during, and until slightly after the transition of the input signal from the high logic level to the low logic level.

As the source-drain terminals of the transistors in inverter circuit 210 may be coupled to different voltage levels based on a transition of the input signal received, the trigger point of inverter circuit 210 may be shifted accordingly. For instance, in the embodiment of FIG. 4A, inverter circuit 210 may have first trigger point 412 when the signal it receives is transitioning from a logic low value to a logic high value, and may have second trigger point 414 when the signal is transitioning from the logic high value back to the logic low value.

In arrangements in which trigger point shift circuit 250 includes both multiplexer 450A and 450B, inverter circuit 210 may have a first trigger point such as trigger point 412 when PMOS transistor 314 is coupled to input 454A of multiplexer 450A and when NMOS transistor 312 is coupled to input 454B of multiplexer 450B. Conversely, inverter circuit 210 may have a second trigger point such as trigger point 414 when PMOS transistor 314 is coupled to input 452A of multiplexer 450A and when NMOS transistor 312 is coupled to input 452B of multiplexer 450B.

If desired, either multiplexer 450A or multiplexer 450B may be omitted.

In arrangements in which trigger point shift circuit 250 includes multiplexer 450A but does not include multiplexer 450B, inverter circuit 210 may have a first trigger point such as trigger point 412 when PMOS transistor 314 is coupled to input 454A of multiplexer. Conversely, inverter circuit 210 may have a second trigger point such as trigger point 414 when PMOS transistor 314 is coupled to input 452A of multiplexer 450A.

In arrangements in which trigger point shift circuit 250 includes multiplexer 450B but does not include multiplexer 450A, inverter circuit 210 may have a first trigger point such as trigger point 412 when NMOS transistor 312 is coupled to input 454B of multiplexer 450B. Conversely, inverter circuit 210 may have a second trigger point such as trigger point 414 when NMOS transistor 312 is coupled to input 452B of multiplexer 450B. These are merely illustrative examples.

In the embodiment of FIG. 4B, the select inputs of multiplexers 450A and 450B are coupled to delay circuit 460. Therefore, it should be appreciated that delay circuit 460 may be used to delay the transition between different trigger points in inverter circuit 210. In one embodiment, delay circuit 460 may provide a sufficient amount of delay for the input signal to fully transition from a logic low value, 0, to a logic high value, and vice versa, before the trigger point shift circuit 250 resets the trigger point of inverter circuit 210.

It should be appreciated that delay circuit 460 may include one or more inverters, one or more buffer circuits, or any other suitable circuits to provide a delay. In one embodiment, delay circuit 460 may be similar to inverter circuit 215 of FIG. 2. In the embodiment of FIG. 2, an input of trigger point shift circuit 250 is coupled to the output of inverter circuit 215. However, it should be appreciated that the input to trigger point shift circuit 250 may be coupled to either the output of inverter circuit 210 or inverter circuit 215 of FIG. 2.

As such, depending on how trigger point shift circuit 250 is connected, the delay provided by delay circuit 460 may be adjusted accordingly. In one embodiment, delay circuit 460 may be a direct connection between the output of inverter 215 and the select input of multiplexers 450A and 450B (e.g., when trigger point shift circuit 250 is coupled to the output of inverter circuit 215 of FIG. 2).

Figure 5:
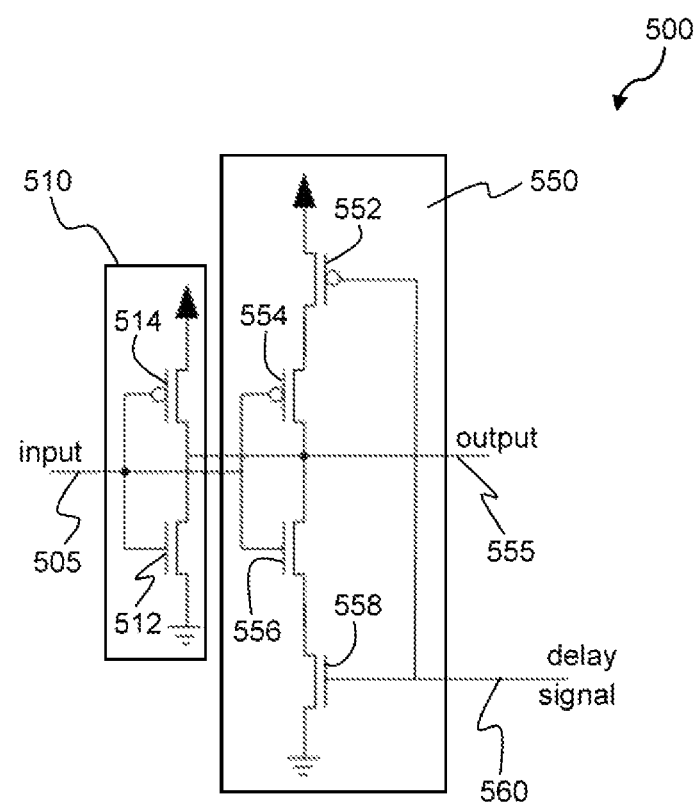
FIG. 5 is another schematic diagram of a trigger point shift circuit coupled to an inverter 510 an embodiment in accordance with the present invention.

FIG. 5, meant to be illustrative and not limiting, shows trigger point shift circuit 550 coupled to inverter 510 as one embodiment in accordance with the present invention. Trigger point shift circuit 550 may include two P-channel transistors, 552 and 554, and two N-channel transistors, 556 and 558, coupled in series. A source-drain terminal of transistor 552 may be coupled to a positive voltage level and a source-drain terminal of transistor 558 may be coupled to ground. The gate of transistor 552 is coupled to the gate of transistor 558 and the gate of transistor 554 is coupled to the gate of transistor 556.

The gates of transistors 552 and 558 may be coupled to receive delay signal 560 from a delay circuit. Delay signal 560 may be a slightly delayed version of output signal 555. In one embodiment, when delay signal 560 is at a logic high level, N-channel transistor 558 is turned on. When the input signal at input terminal 505 is at a logic low level and N-channel transistor 558 is turned on, the trigger point of inverter circuit 510 is pulled down.

In another embodiment, when delay signal 560 is at a logic low level, P-channel transistor 552 may be turned on. When the input signal at input terminal 505 is at a logic high level and P-channel transistor 552 is turned on, the trigger point of inverter circuit 510 is raised. In an exemplary embodiment, delay signal 560 may be adjusted such that the delay period allows the input signal at input terminal 505 to fully transition from one logic level to another logic level before turning on or off transistors 552 and 558.

Figure 6:
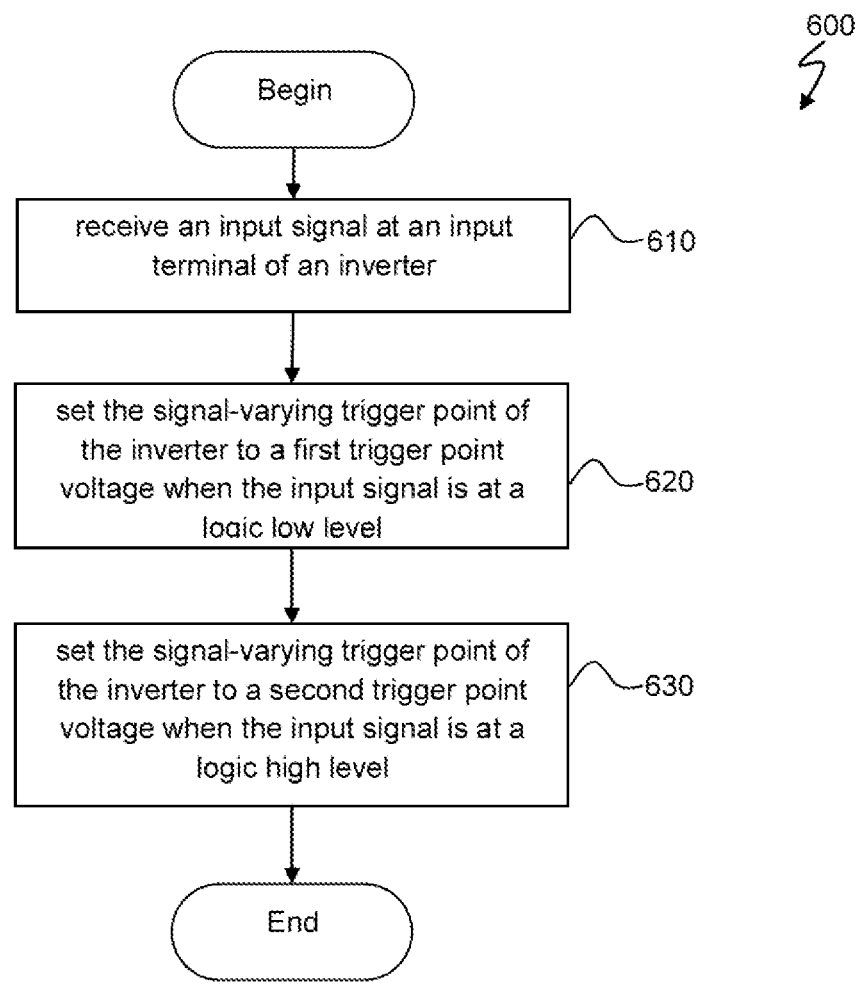
FIG. 6 is a simplified method flow for accelerating a transition of a signal as an embodiment in accordance with the present invention.

FIG. 6, meant to be illustrative and not limiting, shows simplified flow 600 for accelerating a transition of a signal as one embodiment in accordance with the present invention. Flow 600 begins with receiving an input signal at an input terminal of an inverter at step 610. The inverter may be similar to inverter circuit 210 of FIG. 2 and may have first and second power supply inputs with a signal-varying trigger point, which may sometimes be referred to herein as a time-varying trigger point.

At step 620, the signal-varying trigger point of the inverter is set to a first trigger point voltage when the input signal is at a logic low level. In one embodiment, the signal-varying trigger point is set by a trigger point shift circuit similar to trigger point shift circuit 250 of FIG. 2. In another embodiment, the trigger point shift circuit includes a delay circuit to provide an appropriate delay before shifting the trigger point.

At step 630, the signal-varying trigger point of the inverter may further be set to a second trigger point voltage when the input signal is at a logic high level. In an exemplary embodiment, the first trigger point voltage is lower than the second trigger point voltage and the first and second trigger point voltages may be represented by trigger points 412 and 414 of FIG. 4A, respectively.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A circuit comprising:
   an inverter having an input, first and second power supply inputs, and an output, wherein the input is operable to receive an input signal from an external component;
   a first multiplexer coupled to the first power supply input of the inverter, wherein the first multiplexer is operable to couple a selected one of a first voltage level and a second voltage level to the first power supply input, wherein the first multiplexer has a control input; and
   a delay circuit having an input coupled to the output of the inverter and having an output coupled to the control input of the first multiplexer.

2. The circuit defined in claim 1 further comprising:
   a second multiplexer coupled to the second power supply input of the inverter, wherein the second multiplexer is operable to couple a selected one of a third voltage level and a fourth voltage level to the second power supply input, wherein the second multiplexer has a control input, and wherein the output of the delay circuit is coupled to the control input of the second multiplexer.

3. The circuit defined in claim 1, further comprising:
   a second multiplexer coupled to the second power supply input of the inverter, wherein the second multiplexer is operable to couple a selected one a third voltage level and a fourth voltage level to the second power supply input, wherein the second multiplexer has a control input, and wherein the output of the delay circuit is coupled to the control input of the second multiplexer, wherein the first, second, third and fourth voltages are different voltage levels.

4. The circuit defined in claim 3, wherein the inverter comprises:
   a p-channel transistor having a first source-drain terminal coupled to the first power supply input, having a second source-drain terminal, and having a gate terminal; and
   an n-channel transistor having a first source-drain terminal coupled to the second power supply input, having a second source-drain terminal coupled to the second source-drain terminal of the p-channel transistor and coupled to the output of the inverter, and having a gate terminal coupled to the gate terminal of the p-channel transistor.

5. The circuit defined in claim 4, wherein the first and second voltage levels are positive voltage levels, wherein the first voltage level is greater than the second voltage level, wherein the third voltage level is a ground voltage, wherein the fourth voltage level is a negative voltage level, and wherein the delay circuit comprises a plurality of series-connected inverters.

6. The circuit defined in claim 4, wherein the first and second voltage levels are positive voltage levels, wherein the first voltage level is greater than the second voltage level, wherein the third voltage level is a ground voltage, wherein the fourth voltage level is a negative voltage level, wherein the second voltage level is coupled to the first power supply input and the fourth voltage level is coupled to the second power supply input when the input signal is transitioning from a low logic level to a high logic level, wherein the first voltage level is coupled to the first power supply input and the third voltage level is coupled to the second power supply input when the input signal is transitioning from the low logic level to the high logic level, and wherein the delay circuit comprises a plurality of series-connected inverters.

7. A circuit comprising:
an input terminal that receives an input signal;
an inverter circuit coupled to the input terminal, wherein the inverter circuit has a first trigger point as the input signal transitions from a logic low level to a logic high level and wherein the inverter circuit has a second trigger point as the input signal transitions from the logic high level to the logic low level; and
a shifting circuit coupled to the inverter circuit, wherein the shifting circuit is operable to provide trigger signals to the inverter circuit that set the first and second trigger points at different voltages, wherein the inverter circuit comprises first and second power supply terminals, and the shifting circuit comprises:
a multiplexer having a first input operable to receive a first bias voltage, a second input operable to receive a second bias voltage, and an output coupled to the first power supply terminal of the inverter circuit.

8. The circuit defined in claim 7, wherein the shifting circuit is operable to provide the trigger signals such that the first trigger point is at a first voltage and the second trigger point is at a second voltage that is higher than the first voltage.

9. The circuit defined in claim 7, wherein the first power supply terminal comprises a positive power supply terminal, the second power supply terminal comprises a ground power supply terminal, the multiplexer has a control input, and the shifting circuit further comprises:
an additional multiplexer having a control input, a first input operable to receive a third bias voltage, a second input operable to receive a fourth bias voltage, and an output coupled to the ground power supply terminal of the inverter circuit; and
a delay stage coupled between an output terminal of the inverter circuit and the control inputs of the multiplexer and the additional multiplexer.

10. The circuit defined in claim 9, wherein the inverter circuit comprises a first transistor and a second transistor coupled together in series, wherein the output of the multiplexer is coupled a source-drain terminal of the first transistor, and wherein the output of the additional multiplexer is coupled to a source-drain terminal of the second transistor.

11. The circuit defined in claim 9, wherein the first bias voltage is greater than the second bias voltage, the third bias voltage is a ground voltage, and wherein the fourth bias voltage is a negative voltage.

12. The circuit defined in claim 7, wherein the input signal is received from an external component, wherein the circuit forms a programmable interconnect path on an integrated circuit, wherein the external component is a first logic block on the integrated circuit, and wherein the inverter circuit has an output terminal that is coupled to a second logic block on the integrated circuit.

13. The circuit defined in claim 12, wherein the inverter circuit is a receiver circuit having a first drive strength, the circuit further comprising:
an additional inverter circuit, wherein the additional inverter circuit is a driver circuit having a second drive strength that is greater than the first drive strength.

14. The circuit defined in claim 7, wherein the inverter circuit has an output terminal and wherein the shifting circuit comprises:
a first transistor having a gate and a first source-drain terminal coupled to a first voltage level;
a second transistor having a gate and a first source-drain terminal coupled to the first transistor and a second source-drain terminal coupled to the output of the inverter circuit;
a third transistor having a gate coupled to the gate of the second transistor and a first source-drain terminal coupled to the second source-drain terminal of the second transistor; and
a fourth transistor with a first source-drain terminal coupled to the third transistor, a gate coupled to the gate of the first transistor, and a second source-drain terminal coupled to a second voltage level.

15. The circuit defined in claim 14, wherein the inverter circuit is operable to output an output signal on the output terminal, wherein the shifting circuit is operable to receive a delayed version of the output signal at the gates of the first and fourth transistors, and wherein the shifting circuit is operable to receive the input signal at the gates of the second and third transistors.

16. A circuit comprising:
an input terminal that receives an input signal;
a first inverter circuit coupled to the input terminal, wherein the first inverter circuit has a first trigger point as the input signal transitions from a logic low level to a logic high level and wherein the first inverter circuit has a second trigger point as the input signal transitions from the logic high level to the logic low level;
a second inverter circuit coupled to an output of the first inverter circuit; and
a shifting circuit coupled between the first inverter circuit and an output of the second inverter circuit, wherein the shifting circuit is operable to provide trigger signals to the first inverter circuit that set the first and second trigger points at different voltages.

* * * * *